(12) United States Patent
He et al.

(10) Patent No.: US 6,580,639 B1
(45) Date of Patent: Jun. 17, 2003

(54) METHOD OF REDUCING PROGRAM DISTURBS IN NAND TYPE FLASH MEMORY DEVICES

(75) Inventors: Yue-Song He, San Jose; Kent Kuohua Chang, Cupertino; Allen U. Huang, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/372,406

(22) Filed: Aug. 10, 1999

(51) Int. Cl.[7] ............................................... G11C 16/04
(52) U.S. Cl. ................ 365/185.17; 113/63; 113/185.33
(58) Field of Search ........................... 365/185.17, 113, 365/163, 185.33; 257/52, 57, 61

(56) References Cited

U.S. PATENT DOCUMENTS 5,568,421 A * 10/1996 Aritome ................. 365/185.17
5,874,329 A    2/1999 Neary et al. ................. 438/203
6,028,788 A * 2/2000 Choi et al. .......... 365/185.33 X

* cited by examiner

Primary Examiner—Huan Hoang
(74) Attorney, Agent, or Firm—Skjerven Morrill MacPherson LLP; George Wolken, Jr.

(57) ABSTRACT

The present invention makes use of ion bombardment to amorphize the source and drain regions of a short channel FET prior to implanting. The source/drain implants are then localized to a shallow depth by appropriate choice of implanting conditions, typically employing rather low bombardment voltages of approximately 10 KeV. Amorphous source/drain regions substantially hinder the diffusion of source/drain dopants and thereby reduce the possibility of punchthrough and loss of FET function. Such devices are preferably used in NAND type flash memory devices maintaining proper self-boosting voltages and FET functions even when short channel lengths are employed.

10 Claims, 2 Drawing Sheets

METHOD OF REDUCING PROGRAM DISTURBS IN NAND TYPE FLASH MEMORY DEVICES

BACKGROUND OF THE INVENTION

1. Technical Field

The present invention relates to the general field of fabrication of integrated circuits and, more particularly to the fabrication of short-channel FET devices for use in NAND type flash memory and techniques for reducing program disturb conditions disrupting the performance of such devices.

2. Description of Related Art

NAND type semiconductor nonvolatile memories offer several advantages over NOR type memories as described in the work of Arase (U.S. Pat. No. 5,812,457). One advantage of NAND type flash memories is the relatively low current requirements for programming such memories in comparison with NOR memories. On-chip boosting circuits are proposed by Arase as a mode for NAND programming. The work of Runaldue describes an on-chip self-boosting circuit for programming NAND gates (U.S. Pat. No. 5,160,860). However, as the dimensions of FET devices become ever smaller, it becomes increasingly difficult to fabricate reliable NAND type flash memories with self-boost.

FET devices typically have n-doped source and drain regions formed on a lightly p-doped silicon substrate forming the channel between the source and drain regions. At the junction of the source and channel, a region depleted of charge carriers forms. A second depletion region forms at the channel-drain junction. If the length of the channel is large compared to the width of the depletion regions, they do not interact and the FET behaves in a manner similar to isolated n-p junctions. However, for many applications, channel lengths become very small and may be less than 0.3 microns in modern integrated circuits. Such short channel lengths may cause the depletion regions to interact and otherwise lead to a class of "short channel effects" as described in standard reference works (for example, "Silicon Processing for the VLSI ERA: Volume 2, Process Integration" by S. Wolf, Lattice Press, 1990, pp. 338–347). Under the appropriate conditions, the depletion regions may overlap leading to the condition known as "punchthrough" and disruption in the functioning of the FET device. One method to limit the extent of the depletion regions is to limit the depth of the source/drain implants. However, limiting the lateral extent and depth of the source and drain as initially implanted on the substrate is only partially effective as species are prone to diffuse during later thermal processing.

Source/drain spreading by diffusion may be reduced by pre-amorphizing the substrate region into which source/drain implants are to be placed. That is, diffusion through amorphous silicon is significantly hindered in comparison with diffusion through polycrystalline silicon, as used by Lee (U.S. Pat. No. 5,266,510) and Talwar et. al. (U.S. Pat. No. 5,908,307). Thus, shallow implants to form source/drain regions preceded by amorphization of the substrate is one method of reducing the width of the depletion regions and avoiding punchthrough in short channel FETs.

A common method of ameliorating short channel effects, including punchthrough, is to increase the doping of the channel region, as increased channel doping leads to narrower depletion regions. Therefore, higher channel doping permits the use of shorter channel lengths before punchthrough occurs. However, a higher level of channel doping affects both the self-boosting voltage as well as the width of the depletion region. In order to be definite, we provide a numerical example. FIG. 1 illustrates a segment of NAND type flash memory. The following numerical values are by way of illustration and not limitation. Applying 19 volts (for example) to word line ("WL") 9 causes 19 volts to appear at both devices labeled 1. For purposes of illustration we assume that this is sufficient for devices, 1, to be programmed, as desired. The problem is to program only the desired devices, 1, but not device 2 that we assume for this example is not to be programmed. The NAND flash memory depicted in FIG. 1 uses self-boosting voltage to avoid programming device 2. Applying 3.3 volts to bit line ("BL") n−1 causes a self-boost voltage $V_{sb}$, of (say) 6 volts to occur at circuit node 3. Device 2 receives the difference between the word line voltage and the bit line voltage or, in this example, 13 volts. 13 volts is presumed to be insufficient to program device 2 leading to the desired and correct programming of this word in NAND memory.

However, increasing channel doping decreases self-boosting voltage. Thus, for devices having increased channel doping, $V_{sb}$ appearing at 3 may be only 2 volts, resulting in 17 volts being applied to device 2. In many practical circumstances, a NAND memory designed to be programmed with 19 volts may also be programmed with 17 volts. Thus, device 2 will be erroneously programmed along with devices 1 resulting in incorrect data stored in word 9. This "program disturb" is an undesirable side effect of increasing the channel doping to reduce punchthrough.

BRIEF SUMMARY OF THE INVENTION

The present invention makes use of ion bombardment to amorphize the source and drain regions of a short channel FET prior to source/drain implanting. Typical ion bombardments would be by ions of silicon or germanium at energies of approximately 30 KeV delivering a dose of approximately $10^{15}$ ions/cm$^2$. The source/drain implants are then localized to a shallow depth by appropriate choice of implanting conditions, typically employing rather low bombardment voltages of approximately 10 KeV. Amorphous source/drain regions substantially hinder the diffusion of source/drain dopants and thereby reduce the possibility of punchthrough and loss of FET function. Such devices are preferably used in NAND type flash memory devices maintaining proper self-boosting voltages, avoiding program disturbs, and maintaining proper FET function even when short channel lengths are employed.

BRIEF DESCRIPTION OF THE SEVERAL VIEWS OF THE DRAWINGS

None of the figures herein are drawn to scale.

DETAILED DESCRIPTION OF THE INVENTION

In the following description and figures, similar reference numbers are used to identify similar elements.

Figure 1:
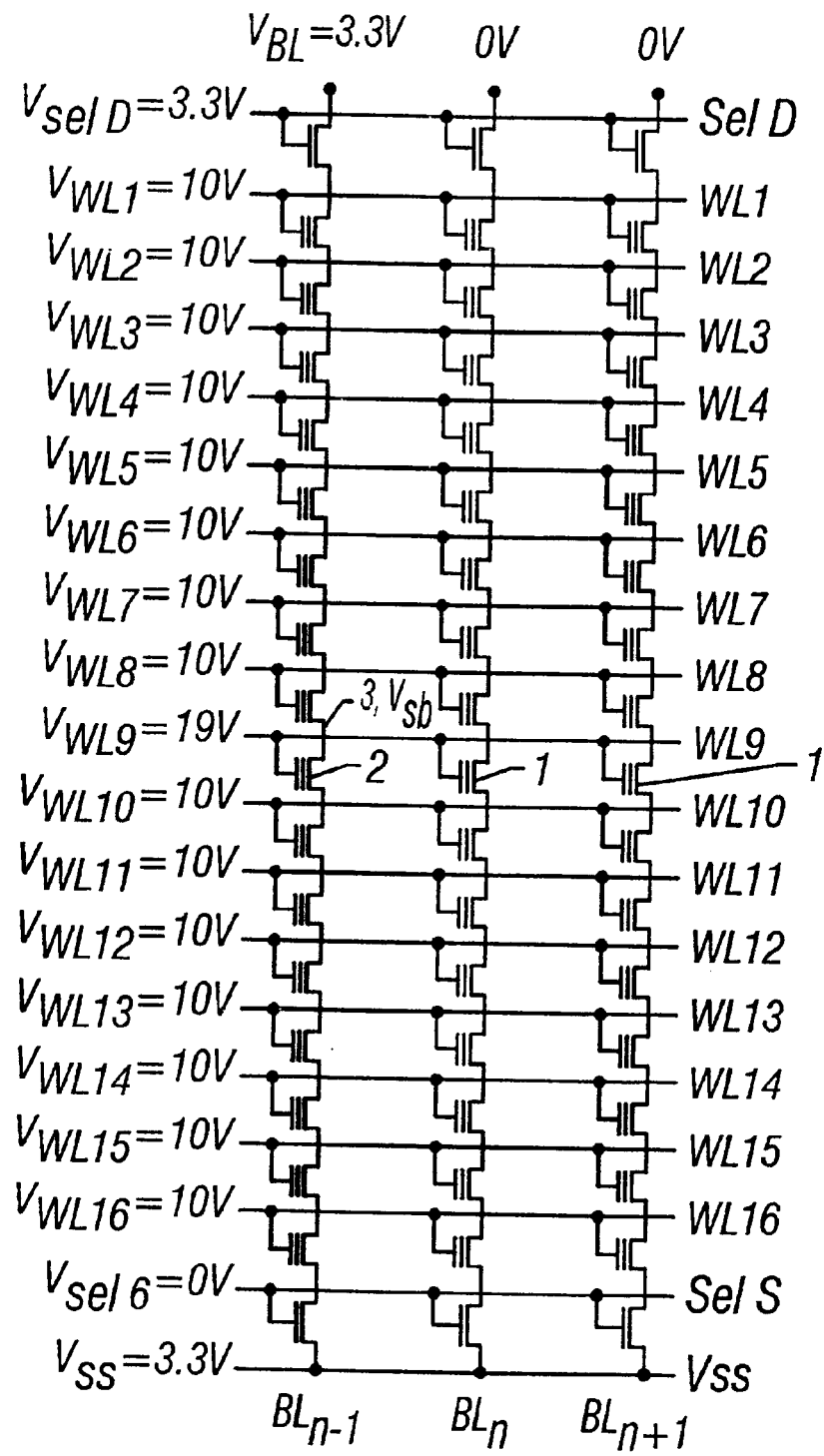
FIG. 1: Circuit diagram of a portion of a NAND type flash memory device.
Figure 2:
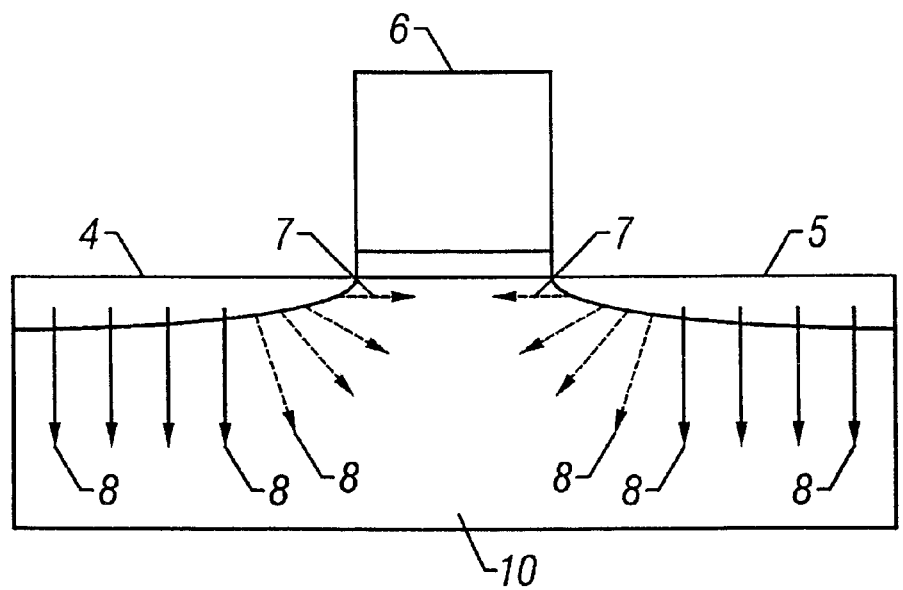
FIG. 2: Schematic cross sectional view along bit line of an FET device depicting source and drain regions and diffusion of dopants.

FIG. 2 depicts in cross section (along the bit line of FIG. 1), the source region, 4 and the drain region, 5, of a typical FET. The source and drain designations are arbitrary and may be interchanged with no effect. A gate structure, 6, sits atop the region between source and drain and typically consists of one or more gates and one or more insulating layers such as oxide, ONO and the like. Source/drain regions, 4 and 5, are typically implanted with dopants to create n-type regions on a slightly p-type silicon substrate, 10. Common dopants for n-type source/drain include phosphorus, antimony and arsenic. Following implant, the dopants typically diffuse away from the source/drain regions, 8, and also diffuse into the channel region beneath gate, 6, denoted by 7 in FIG. 2. This diffusion may occur soon after implanting with dopant or during subsequent thermal cycles applied to the device during subsequent circuit fabrication stages. This spreading of the source/drain leads to increased depletion region widths where the n-type source/drain regions contact the p-type substrate.

Figure 3:
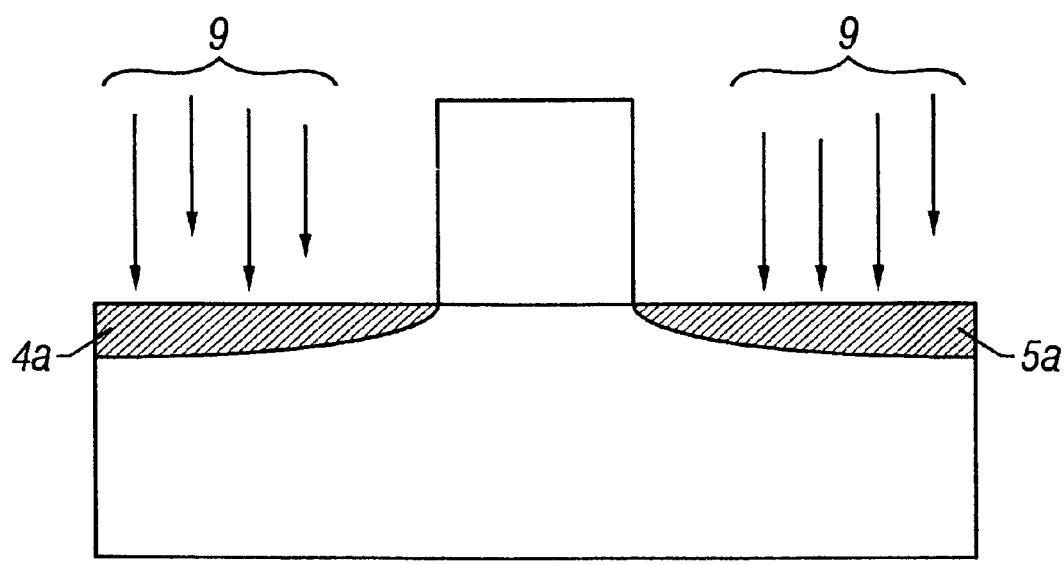
FIG. 3: Schematic cross sectional view along bit line of an FET device depicting the formation of amorphous source and drain regions by ion bombardment prior to implanting.

FIG. 3 depicts the bombardment of source/drain regions with ions, 9, prior to dopant implant. The nature of the ions, 9, and the conditions of bombardment are chosen so as to cause source/drain regions, 4a, 5a, to take on an amorphous structure prior to dopant implant. This pre-amorphization of the source/drain regions hinders diffusion of dopants from the site (as depicted by 8 in FIG. 2). The pre-amorphization step in the present invention typically makes use of Si or Ge ions at impact energies typically in the range of about 30 KeV. Amorphizing ion doses are typically approximately $10^{15}$ ions/cm$^2$. Other ion bombardment conditions, and species may be employed if amorphous source/drain substrates result.

Following amorphization, source/drain implants are performed under conditions leading to shallow implanting, typically around 10 KeV implanting energies. The resulting device as part of a NAND type flash memory provides reduced component size without a reduction in self-boosting voltage nor an increase in the probability of punchthrough.

Having described the invention in detail, those skilled in the art will appreciate that, given the present disclosure, modifications may be made to the invention without departing from the spirit of the inventive concept described herein. Therefore, it is not intended that the scope of the invention be limited to the specific and preferred embodiments illustrated and described. Rather, it is intended that the scope of the invention be determined by the appended claims.

We claim:

1. A NAND type flash memory comprising a plurality of NAND devices wherein the source region and drain region of each of said NAND devices have a structure resulting from amorphizing said source region and said drain region prior to implanting dopants therein.

2. A NAND type flash memory as in claim 1 further comprising voltage self-boosting for programming said NAND devices.

3. A NAND type flash memory as in claim 1 wherein said source region and said drain region of said NAND devices are shallow.

4. A memory as in claim 1 wherein said dopants in said source region and said drain region are implanted to a shallow depth.

5. A memory as in claim 4 wherein said shallow depth results from implanting said dopants with bombardment energies of approximately 10 KeV.

6. A memory as in claim 1 wherein said amorphized source region and said amorphized drain region result from ion bombardment.

7. A memory as in claim 6 wherein said ion bombardment delivers a dose from approximately $1\times10^{15}$ ions per square centimeter to approximately $4\times10^{15}$ ions per square centimeter.

8. A memory as in claim 6 wherein said ions are selected from a group consisting of silicon and germanium.

9. A memory as in claim 6 wherein said bombarding ions have an energy from approximately 10 KeV to approximately 40 KeV.

10. A memory as in claim 9 wherein said bombarding ions have an energy of approximately 30 KeV.

* * * * *